United States Patent
Hoshino

(10) Patent No.: US 7,355,234 B2
(45) Date of Patent: Apr. 8, 2008

(54) SEMICONDUCTOR DEVICE INCLUDING A STACKED CAPACITOR

(75) Inventor: Akira Hoshino, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 18 days.

(21) Appl. No.: 11/324,244

(22) Filed: Jan. 4, 2006

(65) Prior Publication Data

US 2006/0244102 A1 Nov. 2, 2006

(30) Foreign Application Priority Data

May 1, 2005 (JP) .............................. 2005-000699

(51) Int. Cl.
*H01L 29/76* (2006.01)
*H01L 21/20* (2006.01)

(52) U.S. Cl. .............. 257/308; 257/310; 257/E27.092; 257/E21.651; 438/396; 438/398

(58) Field of Classification Search ................ 257/306, 257/308, 310, E27.092, E21.651; 439/396, 439/398

See application file for complete search history.

(56) References Cited

U.S. PATENT DOCUMENTS

| 6,677,217 | B2 * | 1/2004 | Joo et al. ................... 438/398 |
| 6,794,704 | B2 * | 9/2004 | Yates et al. ................. 257/309 |
| 6,884,691 | B2 * | 4/2005 | Marsh ....................... 438/398 |
| 6,964,901 | B2 * | 11/2005 | Pontoh et al. ............... 438/255 |
| 7,112,503 | B1 * | 9/2006 | Agarwal et al. ............ 438/386 |
| 2004/0113235 | A1 * | 6/2004 | Coolbaugh et al. ......... 257/532 |

FOREIGN PATENT DOCUMENTS

| JP | 2000-357783 | 12/2000 |
| JP | 2001-36042 | 2/2001 |

\* cited by examiner

*Primary Examiner*—T. N. Quach
(74) *Attorney, Agent, or Firm*—McGinn IP Law Group, PLLC

(57) ABSTRACT

A stacked capacitor formed in a capacitor hole includes a bottom electrode, capacitor insulation film and a top electrode. The bottom electrode includes a plurality of islands formed on an underlying insulating film, and a metallic film covering the islands on the underlying insulating film. The larger surface of the bottom electrode increases the capacitance of the stacked capacitor.

19 Claims, 4 Drawing Sheets

SEMICONDUCTOR DEVICE INCLUDING A STACKED CAPACITOR

BACKGROUND OF THE INVENTION (a) Field of the Invention

The present invention relates to a semiconductor device including a stacked capacitor and a method for fabricating the same and, more particularly, to a semiconductor device including a stacked capacitor having an increased capacitance and a method for manufacturing such a semiconductor device.

(b) Description of the Related Art

Semiconductor devices, such as DRAM (Dynamic Random Access Memory) devices, include a plurality of memory cells having therein stacked capacitors for storing information. In the stacked capacitors, the electric charge stored therein is reduced along with the elapsed time length, and thus it is necessary to update the information stored therein by the same information at a regular interval. In this update, it is advantageous for the DRAM devices to include stacked capacitors having a larger capacitance because the larger capacitance prolongs the interval of the update and thus reduces the power dissipation of the DRAM devices. The stacked capacitor in general has a MIS structure including a silicon bottom electrode, a capacitor insulation film and a metallic top electrode, and this type of the stacked capacitor is generally called MIS capacitor.

Along with the recent higher integration density of the semiconductor elements, the space for each stacked capacitor is markedly reduced, and it becomes more and more difficult to secure the desired capacitance for the stacked capacitor. Techniques for achieving a higher capacitance with a reduced occupied area of the MIS capacitor include use of a HSG (Hemispherical Grain) structure, wherein the silicon bottom electrode has a large number of hemispherical grains on the surface thereof to have an increased surface area.

FIG. 3 shows a MIS capacitor formed in a conventional semiconductor device, such as DRAM device, and having a HSG structure on the bottom electrode thereof. In FIG. 3, the semiconductor device 30 includes a silicon substrate 11 on which an isolation film 12 made of silicon oxide is formed to isolate element-forming regions. In each of the element-forming regions, transistors each including a gate electrode (not shown) and source/drain diffused regions 13 are formed on the silicon substrate 11. On the gate electrode and the source/drain regions 13, an interlevel dielectric film 15 made of silicon oxide and another interlevel dielectric film 16 made of silicon nitride are consecutively formed.

Contact holes 14a penetrate interlevel dielectric films 15, 16 to reach the source/drain regions 13, and are filled with respective contact electrodes 14.

Another interlevel dielectric film 17 made of silicon oxide having a larger thickness is formed on interlevel dielectric film 16 and the contact electrodes 14. Capacitor-receiving holes (capacitor holes) 18 penetrate interlevel dielectric film 17 to expose respective contact electrodes 14 and a portion of interlevel dielectric film 16 in the vicinity of the contact electrodes 14. The capacitor holes 18 each receive therein a silicon bottom electrode 31 of a hollow cylindrical shape having a HSG structure on the inner sidewall of the capacitor holes 18.

A silicon nitride film 32 covers the surface of the silicon bottom electrodes 31, and a tantalum oxide ($Ta_2O_5$) film covers the surface of the silicon nitride film 32 and interlevel dielectric film 17. The silicon nitride film 32 suppresses the surface oxidation of the silicon bottom electrode 31, and both the silicon nitride film 32 and $Ta_2O_5$ film configure a capacitor insulation film 34 for the stacked capacitors. A metallic top electrode 35 made of TiN covers the surface of the capacitor insulation film 34. One of the bottom electrodes 31, capacitor insulation film 34 and one of the top electrodes 35 configure a stacked capacitor. The HSG structure formed on the bottom electrodes 31 increases the surface of the bottom electrodes 31 to thereby increase the capacitance of the stacked capacitors. A suitable HSG structure is generally formed by using a heat treatment of the silicon layer in a $PH_3$ atmosphere at a substrate temperature of around 700 degrees C.

It is necessary that the space for the stacked capacitors be reduced in the next-generation semiconductor devices. To meet this request, the stacked capacitor must be reduced in size while maintaining the desired capacitance. In the fabrication step of the conventional semiconductor device 30 as described above, a RTN (Rapid Thermal Nitridation) treatment at a substrate temperature of around 700 degrees C. or above is essential to form the HSG structure, which involves formation of a silicon oxide film on the bottom electrode 31 however. The silicon oxide film thus formed has a lower dielectric constant and significantly increases the thickness of the capacitor insulation film to thereby reduce the capacitance of the stacked capacitor. It is generally difficult to remove this silicon oxide film from the bottom electrode.

Thus, use of a MIM capacitor including a metallic bottom electrode, a capacitor insulation film and a metallic top electrode is studied instead of the MIS capacitor, for preventing formation of the silicon oxide film having a lower dielectric constant.

FIG. 4 shows an example of a semiconductor device including the MIM capacitor. The semiconductor device 40 shown in FIG. 4 is similar to the semiconductor device 30 shown in FIG. 3 except for the structure of the stacked capacitor, and thus description of other elements will be omitted here by denoting similar elements by similar reference numerals. The MIM capacitor includes a metallic bottom electrode 41 made of TiN, for example, having a relatively flat surface, and a top electrode 43 opposing the bottom electrode 41 with an intervention of a capacitor insulation film 42 made of $Al_2O_3$.

In the MIM capacitor shown in FIG. 4, the capacitor insulation film 42 has a smaller thickness and a higher dielectric constant compared to the capacitor insulation film 34 of the MIS capacitor wherein a silicon oxide film is formed by the RTN treatment. This structure itself allows the stacked capacitor to have a larger capacitance. However, since the bottom electrode 41 of the MIM capacitor has a flat surface and thus a smaller surface area compared to the silicon bottom electrode 31 having a HSG structure in the MIS capacitor. Thus, a desired large capacitance is also difficult to achieve in the MIM capacitor.

JP-A-2000-357783 describes a MIM capacitor including a bottom electrode having an increased surface area. The bottom electrode described in the publication has a convex and convex surface. It is described in the publication that the bottom electrode is deposited by sputtering of a metal at a substrate temperature of 500 to 600 degrees C., or is formed by sputtering at a substrate temperature of 300 to 400 degrees C. and an additional heat treatment at a substrate temperature of 600 to 700 degrees C.

DISCLOSURE OF THE INVENTION

(a) Problem to be Solved by the Invention

It is desired in the next-generation semiconductor devices that a high-temperature heat treatment such as at a substrate temperature exceeding 500 degrees C. be omitted in view that the high-temperature heat treatment degrades the characteristic of the transistors formed prior to the high-temperature heat treatment. Since the MIM capacitor described in the above publication necessitates the high-temperature heat treatment exceeding 500 degrees C., this technique for forming the MIM capacitor cannot be used without degrading the transistor characteristic in fabrication of the next-generation semiconductor devices.

In view of the above problems in the conventional techniques, it is an object of the present invention to provide a semiconductor device including a MIM capacitor having a larger capacitance, which can be manufactured without using the high-temperature heat treatment.

It is another object of the present invention to provide a method for manufacturing such a semiconductor device.

(b) Means for Solving the Invention

The present invention provides a semiconductor device comprising a substrate, an insulating film overlying said substrate, and a stacked capacitor including a bottom electrode, a capacitor insulation film and a top electrode consecutively deposited, wherein said bottom electrode includes a plurality of islands formed on said insulating film and a metallic or alloy film covering said islands on said insulating film.

The present invention also provides a method for manufacturing a semiconductor device including: forming a capacitor hole in an insulating film; depositing Co on the insulating film including inside of the capacitor hole at a temperature of not higher than 500 degrees C., to form a Co film having a convex and concave surface: forming a metallic or alloy film having a convex and concave surface on the Co film; and forming a stacked capacitor including a top electrode, a capacitor insulation film and a bottom electrode, the bottom electrode including the metallic or alloy film.

EFFECT OF THE INVENTION

In accordance with the semiconductor device of the present invention, the effective opposing area of the stacked capacitor in which the bottom electrode and the top electrode oppose each other is increased by the islands formed in the bottom electrode, to thereby increases the capacitance of the stacked capacitor In accordance with a semiconductor device manufactured by the method of the present invention, the effective opposing area of the stacked capacitor in which the bottom electrode and the top electrode oppose each other is increased by the convex and concave surface of the Co film, without incurring degradation of the transistors in the semiconductor device due to the lower substrate temperature of not higher than 500 degrees C. used in the deposition of the Co film.

The above and other objects, features and advantages of the present invention will be more apparent from the following description, referring to the accompanying drawings.

BEST MODE FOR CARRYING OUT THE INVENTION

Before describing embodiments of the present invention, the principle of the present invention will be described for a better understanding of the present invention.

The present inventor conducted a study for increasing the capacitance of a MIM capacitor, and found that deposition of a Co film on an underlying insulating film, such as made of silicon oxide, at a substrate temperature below 500 degrees C. provided a convex and concave surface on the Co film. If the Co film having such a structure is used as at least a portion of the bottom electrode, the bottom electrode will have a larger surface area due to the convex and concave surface.

Figure 5A:
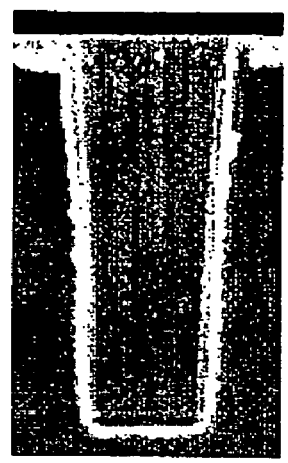
FIG. 5A to 5C are electron micrographs of semiconductor devices after deposition of a Co film
Figure 5B:
Figure 5C:
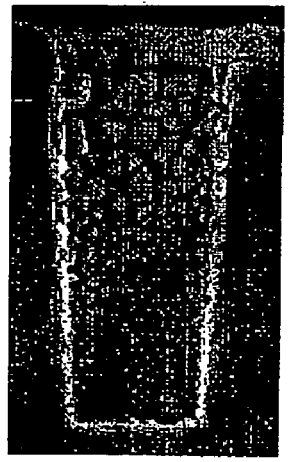

FIGS. 5A to 5C show electron micrographs of the Co film after deposition thereof on a silicon oxide in an experiment. In this experiment, a cylindrical groove having a 1-μm depth and an about 0.5-μm diameter is formed as a capacitor hole in a silicon oxide film, followed by deposition of the Co film thereon by sputtering. FIG. 5A to 5C show the Co films sputtered at substrate temperatures of 25 degrees C. (room temperature), 200 degrees C. and 400 degrees C., respectively. In these figures, the Co film has an irregular surface, i.e., a convex and concave surface. In particular, of these figures, FIG. 5C shows a most remarkable irregular surface including a large number of islands, which are apart from one another on the underlying silicon oxide film. The islands of Co film had an average of 30-nm height, 15- to 30-nm diameter, and 2- to 15-nm pitches between the projections.

In a subsequent experiment, it was found that the Co film having such islands was formed only at substrate temperatures of not lower than 350 degrees C. The conceivable reason of the irregular surface is that an aggregation force is applied between the Co particles. In addition, the conceivable reason of occurring of the islands is that a higher temperature intensifies the aggregation force between the Co particles.

Based on the above findings, the method of the present invention includes, in a preferable embodiment thereof, the steps of forming a Co film on an underlying insulation film at a substrate temperature of not higher than 500 degrees C., and forming a capacitor having a bottom electrode including at least the Co film thus formed. The above limit of the substrate temperature may be preferably lowered down to 450 degrees C. for reducing the adverse influence on the transistors formed prior to the step of forming the Co film. The lower limit of the substrate temperature may be set at 350 degrees C. for effectively increasing the surface area of the bottom electrode by generation of the islands.

It is preferable that the capacitor insulation film in the stacked capacitor include $Al_2O_3$ or $HfO_2$ having a higher dielectric constant. The $Al_2O_3$ or $HfO_2$ film can be deposited at a substrate temperature of not higher than around 500 degrees C., to thereby reduce the adverse influence on the transistors.

Figure 1:
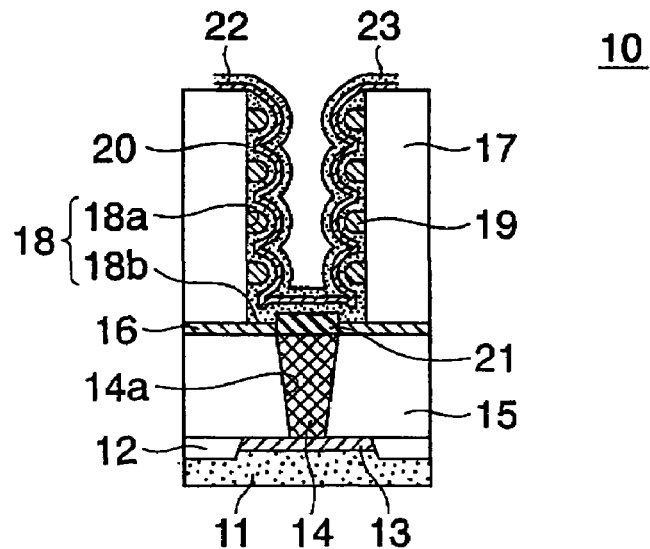
FIG. 1 is a sectional view of a semiconductor device according to an embodiment of the present invention.

Now, the present invention is more specifically described with reference to accompanying drawings, wherein similar constituent elements are designated by similar reference numerals throughout the drawings. FIG. 1 shows a semiconductor device according to an embodiment of the present invention in a sectional view as viewed along the direction in which an array of the source/drain regions are arranged. The semiconductor device 10 includes stacked capacitors having a MIM structure and formed on a p-type silicon substrate 11.

On the surface region of the silicon substrate 11 is formed an element isolation film 12 made of silicon oxide within a shallow isolation trench, for isolation of element-forming areas. In each of the element-forming areas, transistors each includes a gate electrode (not shown) formed on the silicon substrate 11 via an intervention of a gate oxide film (not shown), and n-type source/drain diffused regions 13 formed in the surface region of the silicon substrate 11. An interlevel dielectric film 15 made of silicon oxide and another interlevel dielectric film 16 made of silicon nitride are consecutively formed on the silicon substrate 11 to cover the gate electrode. Contact holes 14a penetrate interlevel dielectric films 15, 16 to reach the source/drain diffused regions 13, and are filled with contact electrodes 14 made of polysilicon.

Another interlevel dielectric film 17 made of silicon oxide having a large thickness is formed on the contact electrodes 14 and interlevel dielectric film 16. Cylindrical capacitor holes 18 penetrate interlevel dielectric film 17 to expose top of the respective contact electrodes 14 and the vicinity thereof. Island projections 19 of Co film are formed on the inner wall 18a of the capacitor holes 18, and bottom electrodes 20 made of TiN are formed in the capacitor holes 18 on the islands 19 and the bottom 18b of the capacitor holes 18. A cobalt silicide film 21 is formed between the bottom electrodes 20 and the contact electrodes 14.

A capacitor insulation film 22 made of aluminum oxide ($Al_2O_3$) is formed on the bottom electrodes 20 and interlevel dielectric film 17, and top electrodes 23 made of TiN are formed on the capacitor insulation film 22. One of the bottom electrodes 20, the capacitor insulation film 22 and one of the top electrodes 23 configure a stacked capacitor.

In the semiconductor device of the present embodiment, the islands 19 of Co film formed on the inner wall 18a of the capacitor holes 18 increase the effective surface area in which the bottom electrodes 20 and top electrodes 23 oppose each other, thereby increasing the capacitance of the stacked capacitors.

FIGS. 2A to 2E show consecutive steps of a fabrication process for manufacturing a semiconductor device, according to an embodiment of the present invention. First, an element isolation film 12 is formed within a shallow isolation trench to isolate element-forming areas from one another. Gate electrodes (not shown) of transistors are formed on the silicon substrate 11 in the element-forming areas, followed by forming n-type source/drain diffused regions 13 by ion implantation and a subsequent heat treatment. Thereafter, interlevel dielectric films including silicon oxide film 15, silicon nitride film 16 are consecutively deposited on the gate electrodes and the silicon substrate 11. Subsequently, interlevel dielectric films 15, 16 are etched by using a photolithographic and etching technique to form contact holes 14a exposing therethrough portions of the source/drain regions 13.

Thereafter, the contact holes 14a are filled with polysilicon by using a CVD technique. A portion of the polysilicon overlying interlevel dielectric film 16 is removed by a dry etching or CMP technique, to leave the polysilicon within the contact holes 14a. Thus, contact electrodes 14 connected to the source/drain regions 13 are formed.

Figure 2A:
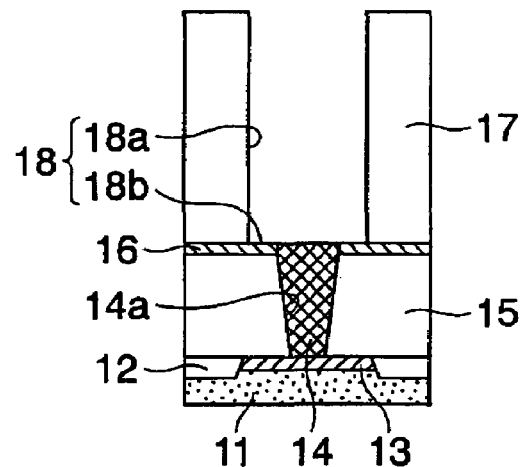
FIGS. 2A to 2E are sectional views consecutively showing fabrication steps of a process for manufacturing a semiconductor device according to the present invention.

Thereafter, another interlevel dielectric film 17 made of silicon oxide is formed on the contact electrodes 14 and interlevel dielectric film 16. Subsequently, capacitor holes 18 which penetrate interlevel dielectric film 17 to expose the top of the contact electrodes 14 are formed by using a photolithographic and etching technique, as shown in FIG. 2A.

Figure 2B:
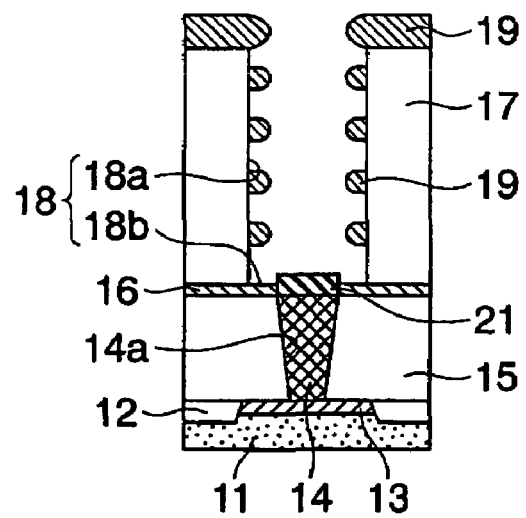

Thereafter, Co is sputtered onto interlevel dielectric film 17 including the capacitor holes 18 in an Ar atmosphere at a pressure of 2 mTorr and a substrate temperature of 400 degrees C., to deposit a Co film having an average thickness of 120 nm. In this condition of deposition, the resultant Co film is configured as islands within the capacitor holes 18 and a normal Co film on interlevel dielectric film 17. The reason of formation of the normal Co film on interlevel dielectric film 17 is that the deposition rate of the sputtered Co is larger on interlevel dielectric film 17 than on the inner wall of the capacitor holes 18, and the islands initially formed on interlevel dielectric film 17 are aggregated together to form the continuous Co film. The Co sputtered onto the top of the silicon contact electrodes 14 does not aggregate, and forms a cobalt silicide film 21 on the entire surface or a portion of the contact electrodes 14, as shown in FIG. 2B.

In general, when a deposition is performed using a sputtering technique onto a film having a hole therein, the sputtered material is deposited to a larger thickness on the film than in the hole. Thus, the optimum film thickness for obtaining the islands should be determined based on the location for the deposition, shape of the hole, coverage of the sputtering, deposition rate etc.

Figure 2C:
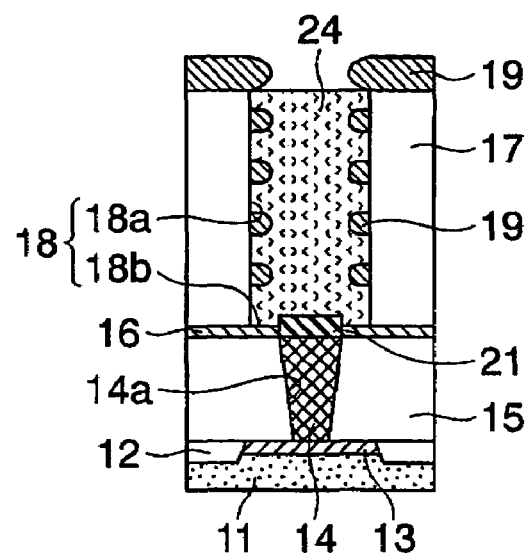
Figure 2D:
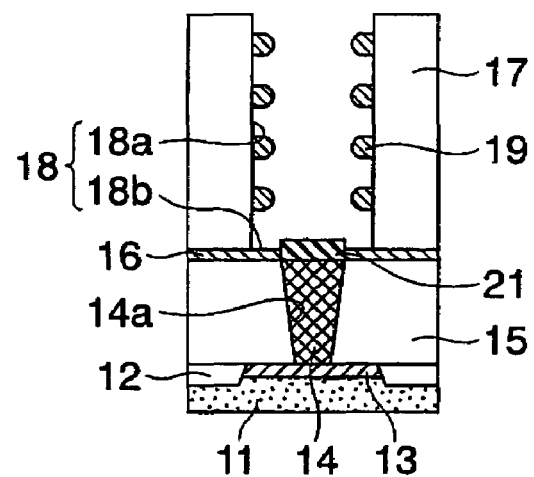

Thereafter, as shown in FIG. 2C, the capacitor holes 18 are filled with resist 24 by using a photolithographic technique, followed by etching the Co film 19 formed on interlevel dielectric film 17. The removal of the Co film 19 on interlevel dielectric film 17 may be performed by wet etching instead. Then, the resist 24 is removed from the capacitor holes 18, as shown in FIG. 2D.

Figure 2E:
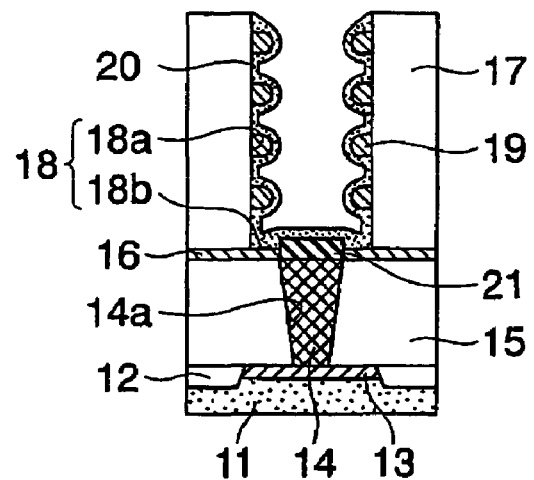
Figure 3:
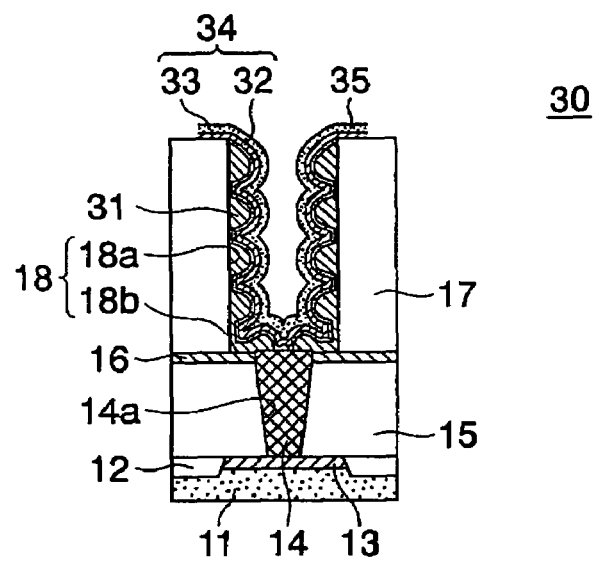
FIG. 3 is a sectional view of a conventional semiconductor device having a MIS capacitor.
Figure 4:
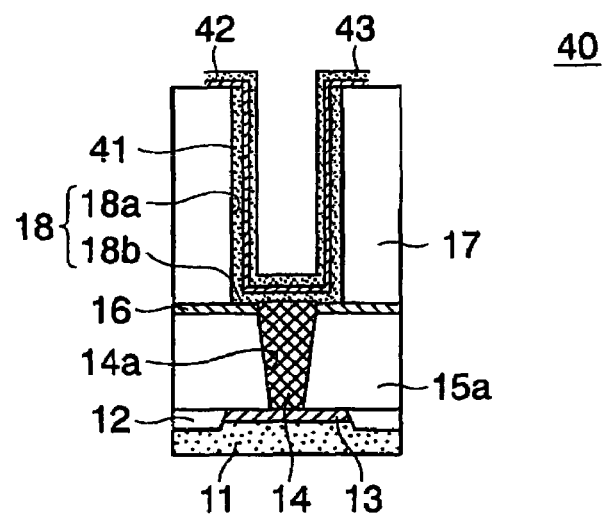
FIG. 4 is a sectional view of another conventional semiconductor device having a MIM capacitor.

Thereafter, the wafer is heated up to a temperature of 500 degrees C., and a CVD process is conducted using titanium tetrachloride as a source gas to deposit a TiN film on the entire surface. The TiN film thus deposited has a concave and convex surface reflecting the islands of Co film. Subsequently, a portion of the TiN film formed on interlevel dielectric film 17 is removed using a photolithographic and etching technique, to leave the TiN film within the capacitor holes 18. Thus, bottom electrodes 20 having a concave and convex surface are obtained, as shown in FIG. 2E.

Thereafter, the resultant wafer is heated up to a substrate temperature of 450 degrees C., and a CVD process is conducted using trimethylaluminum (TMA) as a source gas to deposit a capacitor insulation film 22 made of Al2O3. Subsequently, a top electrode film 23 is deposited on the capacitor insulation film 22 by using a technique similar to that used for depositing the bottom electrodes 21. The islands 19 of Co film has a heat resistance at a temperature of 500 degrees C. or above, whereby the islands 19 are not adversely affected by the deposition of the electrodes and capacitor insulation film. Subsequently, the capacitor insulation film 22 and top electrode film 23 are patterned to thereby configure stacked capacitors. As a result, the semiconductor device 10 having MIM capacitors shown in FIG. 1 is obtained.

In accordance with the method for manufacturing a semiconductor device of the present embodiment, islands 19 of Co film can be formed at a substrate temperature of around 400 degrees C., thereby suppressing the adverse influence on the transistors formed prior to the deposition process.

It is to be noted that although the islands of Co film are deposited, the islands are not necessarily made of Co, and other materials may be used for the islands so long as the other materials provide a convex and concave surface for the bottom electrodes such as by aggregation. It is preferable that the other materials have a heat resistance at a temperature of 500 degrees C. or above, and be deposited at a substrate temperature of 500 degrees C. or below to form a convex and concave surface or islands. The capacitor insulation film may include a material other than aluminum oxide, such as hafnium oxide $HfO_2$, which may be deposited by a CVD process using tetra-ethylmethyl-amino-hafnium (TemaHf) as a source gas.

Since the above embodiments are described only for examples, the present invention is not limited to the above embodiments and various modifications or alterations can be easily made therefrom by those skilled in the art without departing from the scope of the present invention. For example, although the concave and convex surface is formed on substantially entirety of the bottom electrode, a portion of the bottom electrode may have the convex and concave surface.

What is claimed is:

1. A semiconductor device comprising:
   a substrate;
   an insulating film overlying said substrate;
   a contact electrode disposed proximate said insulating film and overlying said substrate; and
   a stacked capacitor including a bottom electrode, a capacitor insulation film and a top electrode consecutively deposited,
   wherein said bottom electrode includes a plurality of islands formed on said insulating film and a film formed on a surface portion of said contact electrode, and one of a metallic and alloy film covering said islands on said insulating film and said film formed on said surface portion of said contact electrode, and
   wherein said plurality of islands include Co.

2. The semiconductor device according to claim 1, wherein said capacitor insulation film includes at least one of $Al_2O_3$ and $HfO_2$.

3. The semiconductor device according to claim 1, further comprising a transistor connected to said stacked capacitor.

4. The semiconductor device according to claim 1, wherein said film formed on a surface portion of said contact electrode includes Co.

5. The semiconductor device according to claim 1, wherein said stacked capacitor comprises a convex surface and a concave surface.

6. The semiconductor device according to claim 5, wherein said top electrode includes a convex surface and a concave surface.

7. The semiconductor device according to claim 1, wherein said stacked capacitor comprises a planar surface over said contact electrode.

8. The semiconductor device according to claim 7, wherein said top electrode includes a planar surface over said contact electrode and below a top surface of said stacked capacitor.

9. A method for manufacturing a semiconductor device comprising:
   forming a capacitor hole in an insulating film;
   depositing Co on said insulating film including inside of said capacitor hole and a contact electrode at a temperature of not greater than 500 degrees C., to form a Co film including a convex and concave surface on said insulating film and a film on a surface portion of said contact electrode;
   forming one of a metallic and alloy film including a convex and concave surface on said Co deposited on said insulating film, and a planar film on said contact electrode; and
   forming a stacked capacitor including a top electrode, a capacitor insulation film and a bottom electrode, said bottom electrode including one of said metallic and said alloy film.

10. The method according to claim 9, wherein at least a portion of said deposited Co includes a plurality of islands.

11. The method according to claim 9, wherein said Co depositing is conducted at a temperature of not greater than 450 degrees C.

12. The method according to claim 11, wherein said Co depositing is conducted at a temperature of not less than 350 degrees C.

13. The method according to claim 12, wherein at least a portion of said Co film formed by said Co depositing configures a plurality of islands.

14. The method according to claim 9, wherein said capacitor insulation film includes at least one of $Al_2O_3$ and $HfO_2$.

15. The method according to claim 9, wherein at least a portion of said deposited Co film includes a planar film formed on said contact electrode.

16. The method according to claim 9, wherein said stacked capacitor comprises a convex surface and a concave surface.

17. The method according to claim 16, wherein said top electrode includes a convex surface and a concave surface.

18. The method according to claim 9, wherein said stacked capacitor comprises a planar surface over said contact electrode.

19. The method according to claim 18, wherein said top electrode includes a planar surface over said contact electrode and below a top surface of said stacked capacitor.

* * * * *